United States Patent
Yamanoue et al.

(10) Patent No.: US 6,936,520 B2
(45) Date of Patent: Aug. 30, 2005

(54) METHOD FOR FABRICATING SEMICONDUCTOR DEVICE HAVING GATE ELECTRODE TOGETHER WITH RESISTANCE ELEMENT

(75) Inventors: Akira Yamanoue, Kawasaki (JP); Satoshi Sekino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/673,354

(22) Filed: Sep. 30, 2003

(65) Prior Publication Data

US 2004/0097032 A1 May 20, 2004

(30) Foreign Application Priority Data

Oct. 31, 2002 (JP) ........................................ 2002-317326

(51) Int. Cl.⁷ .............................................. H01L 21/20
(52) U.S. Cl. ...................... 438/383; 438/385; 438/238
(58) Field of Search ............................... 438/238, 283, 438/382, 383, 385

(56) References Cited

U.S. PATENT DOCUMENTS

| | | | | |
|---|---|---|---|---|
| 5,506,158 A | * | 4/1996 | Eklund | 438/202 |
| 5,620,922 A | * | 4/1997 | Yoshida et al. | 438/210 |
| 5,866,451 A | * | 2/1999 | Yoo et al. | 438/241 |
| 5,904,512 A | * | 5/1999 | Chang et al. | 438/158 |
| 6,156,602 A | * | 12/2000 | Shao et al. | 438/238 |
| 6,180,462 B1 | * | 1/2001 | Hsu | 438/275 |
| 6,204,105 B1 | * | 3/2001 | Jung | 438/238 |
| 6,387,745 B1 | * | 5/2002 | Onoda et al. | 438/237 |
| 6,613,625 B1 | * | 9/2003 | Hasegawa et al. | 438/210 |
| 6,727,133 B1 | * | 4/2004 | Baldwin | 438/210 |
| 6,730,554 B1 | * | 5/2004 | Baldwin et al. | 438/210 |

FOREIGN PATENT DOCUMENTS

| | | |
|---|---|---|
| JP | 8-148649 | 6/1996 |
| JP | 10-150154 | 6/1998 |
| JP | 2001-7220 | 1/2001 |
| JP | 2001-168281 | 6/2001 |

\* cited by examiner

*Primary Examiner*—George Fourson
*Assistant Examiner*—Fernnando L. Toledo
(74) *Attorney, Agent, or Firm*—Westerman, Hattori, Daniels & Adrian, LLP

(57) ABSTRACT

A method for fabricating a semiconductor device comprises the steps of forming a polysilicon film 32 on a silicon substrate 10, implanting a dopant into a region of the polysilicon film 32 for a resistance element to be formed in, patterning the polysilicon film 32 to from the resistance element 46 of the polysilicon film 32 with the dopant inplanted in and gate electrodes 44a, 44b of the polysilicon film 32 with the dopant not implanted in. Accordingly, resistance element can be formed while suppressing influences on characteristics of the transistor formed on one and the same substrate concurrently with forming the resistance element.

19 Claims, 8 Drawing Sheets

FIG. 1

TEM IMAGE OF TRANSISTOR

METHOD FOR FABRICATING SEMICONDUCTOR DEVICE HAVING GATE ELECTRODE TOGETHER WITH RESISTANCE ELEMENT

CROSS-REFERENCE TO RELATED APPLICATION

This application is based upon and claims priority of Japanese Patent Application No. 2002-317326, filed on Oct. 31, 2002, the contents being incorporated herein by reference.

BACKGROUND OF THE INVENTION

The present invention relates to a method for fabricating a semiconductor device, more specifically a method for fabricating a semiconductor device having a transistor and a resistance element.

In semiconductor devices, one of elements used in analog circuits, etc. is a resistance element of polysilicon. Usually the resistance element of polysilicon is formed of polysilicion film used for forming the gate electrodes, concurrently with forming the gate electrodes. Generally, the resistance value of the resistance element of polysilicon is adjusted as required, by ion implantation of a dopant.

On the other hand, in logic devices, generally the gate electrodes and the source/drain regions of the transistors are silicided. Here, in forming the resistance elements concurrently with forming the transistors, silicide block for covering the resistance elements with silicon oxide film is performed for the prevention of siliciding the resistance elements before the step of siliciding the gate electrodes, etc.

In the silicide block the resistance elements are covered with silicon oxide film. Accordingly, it is necessary to implant ions for adjusting a resistance value of the resistance elements prior to the silicide block.

Conventionally, the ion implantation for adjusting resistance values of such resistance elements have been performed before the gate electrodes and the resistance elements are processed (see, e.g., Japanese Patent Application Laid-Open Publication No. 2001-7220, Japanese Patent Application Laid-Open Publication No. Hei8-148649 (1996), Japanese Patent Application Laid-Open Publication No. Hei10-150154 (1998) and Japanese Patent Application Laid-Open Publication No. 2001-168281).

First, a polysilicon film which is to form the gate electrodes and the resistance elements is formed on a semiconductor substrate.

Then, dopant ions are implanted into regions of the polysilicon film for the gate electrodes to be formed in and into regions of the polysilicon film for the resistance elements to be formed in.

Then, the polysilicon film is etched to form the gate electrodes and the resistance elements.

Then, the source/drains, etc. of the transistors are formed by the usual semiconductor fabrication process, and the resistance elements are formed concurrently with forming the transistors.

As described above, conventionally, in forming the resistance elements concurrently with forming the transistors, the regions of the polysilicon film for the transistors to be formed in and the regions of the polysilicon film for the resistance elements to be formed in are doped before the gate electrodes are formed.

However, in forming CMOS transistors, n type doping and p type doping make the etching mechanism of the polysilicon film different between the n type doped regions and the p type doped regions. This has made it difficult to process the n type gate electrodes and the p type gate electrodes into the same configuration.

SUMMARY OF THE INVENTION

An object of the present invention is to provide a method for fabricating a semiconductor device, which can form the resistance element while suppressing influences on characteristics of the transistor to be formed on one and the same substrate.

According to one aspect of the present invention, there is provided a method for fabricating a semiconductor device comprising the steps of: forming a semiconductor film over a semiconductor substrate; implanting a dopant into a prescribed region of the semiconductor film; and patterning the semiconductor film to form a resistance element of the semiconductor film with the dopant implanted, and a gate electrode of the semiconductor film with the dopant not implanted.

As described above, according to the present invention, a semiconductor film is formed on a semiconductor substrate, a dopant is implanted into a required region of the semiconductor film, the semiconductor film is patterned to form a resistance element of the doped semiconductor film and a gate electrode of the semiconductor film which is not doped, whereby the resistance element can be formed while influences on characteristics of the transistor to be formed on one and the same substrate being suppressed.

According to the present invention, after the gate electrode have been formed of the undoped semiconductor film, a dopant is implanted into the gate electrode, which makes it possible to form the gate electrodes of transistors of different conduction types in the same configuration.

DETAILED DESCRIPTION OF THE INVENTION

The method for fabricating the semiconductor device according to one embodiment of the present invention will be explained with reference to FIGS. 1, 2A–2C, 3A–3C, 4A–4C, 5A–5C, 6A–6C, 7A–7C and 8A–8B.

As described above, when dopant ions are implanted in the regions of the polysilicon film for the transistors to be formed in and the regions for the resistance elements to be formed in, the conventional art has found it difficult to process the n type gate electrodes and the p type gate electrodes in the same configuration.

As means for preventing such inconvenience in the gate processing, it is proposed to implant ions after the gate electrodes and the resistance elements have been processed. When the ion implantation into the resistance elements after the polysilicon film has been processed, a photoresist film as a mask for the ion implantation must be formed in the regions for the transistors to be formed in. Then, the resist film must be removed after the ion implantation for adjusting the resistance value of the resistance elements has been performed.

However, the removal of the resist film covering the regions for the transistors to be formed in with the gate electrodes formed in is one cause for lowering characteristics of the transistors as described below. In removing resist films, usually ashing and wet processing using sulfuric acid-hydrogen peroxide mixture and ammonia-hydrogen peroxide mixture are used. The ashing and wet processing withdraw the surface of the silicon substrate in the transistor regions.

Figure 1:
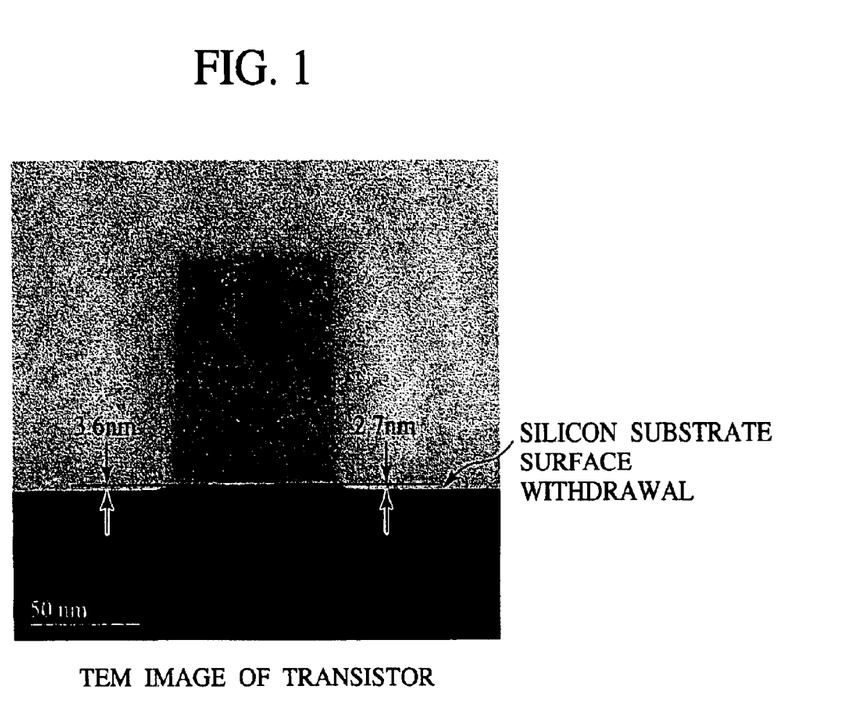
FIG. 1 is a view of a state of the withdrawn silicon substrate surface around a gate electrode observed by a transmission electron microscope.

FIG. 1 is a view of a state of the surroundings of a gate electrode after the resist film has been removed, which was observed by a transmission electron microscope. As evident from the transmission electron microscopic image shown in FIG. 1, the surface of the silicon substrate on both sides of the gate electrode is withdrawn by the step of removing the resist film.

The amount of the withdrawal of the silicon substrate surface caused by the step of removing the resist film is as small as some namometers. However, as devices are increasingly micronized, the source/drain regions are becoming very shallow. The withdrawal of the silicon substrate surface affects the profile of the source/drain regions, which is a cause for varied transistor characteristics and characteristics deterioration.

The resistance elements do not have to be formed essentially concurrently with forming the transistors. The times of ashing, etc. for removing the resist film are different between a case where the resistance elements are formed concurrently with forming the transistors and a case where the former is not formed concurrently with the latter, or are different depending on numbers of the resistance elements to be formed concurrently with forming the transistors, which will cause varied transistor characteristics.

Accordingly, in a case that dopant ions are implanted into the resistance elements simply after the gate electrodes have been processed as described above, even though the gate electrodes can be patterned in the same configuration, it is conceivable that an additional disadvantage of deteriorated transistor characteristics due to the withdrawal of the silicon substrate surface around the gate electrodes will take place.

The method for fabricating the semiconductor device according to the present embodiment enables resistance elements to be formed concurrently with forming transistors on one and the same substrate, suppressing influences on transistor characteristics while preventing the deterioration of the transistor characteristics due to the withdrawal of the surface of a silicon substrate around gate electrodes. The semiconductor device fabricating method according to the present embodiment will be detailed below with reference to FIGS. 2A–2C, 3A–3C, 4A–4C, 5A–5C, 6A–6C, 7A–7C and 8A–8B. FIGS. 2A–2C, 3A–3C, 4A–4C, 5A–5C, 6A–6C, 7A–7C and 8A–8B are sectional views of a semiconductor device in the steps of the method for fabricating the same according to the present embodiment, which show the method. In the present embodiment, the semiconductor device having resistance elements and CMOS transistors will be exemplified.

Figure 2A:
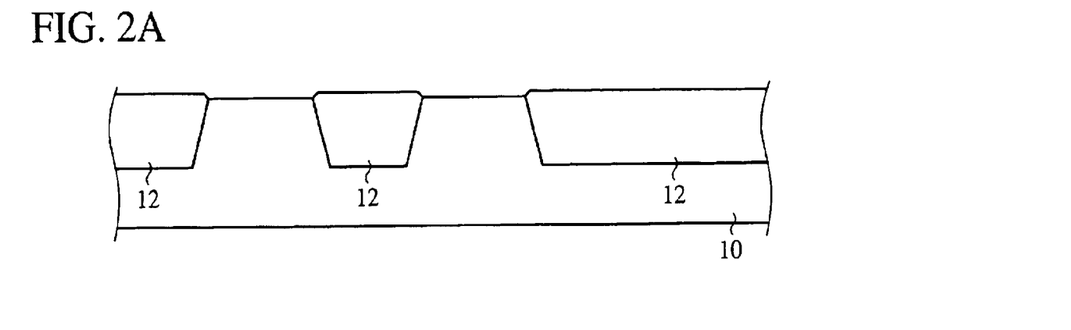
FIGS. 2A–2C are sectional views of a semiconductor device in the steps of the method for fabricating the same according to one embodiment of the present invention, which show the method (Part 1).

First, an element isolation film 12 for defining active regions is formed in a silicon substrate 10 by, e.g., STI (Shallow Trench Isolation) (see FIG. 2A).

Next, a resist film 14 is formed on the entire surface by, e.g., spin coating. Then, the resist film 14 is patterned by photolithography to form in the resist film 14 an opening for exposing a region 16 of an active region for an NMOS transistor to be formed in.

Figure 2B:
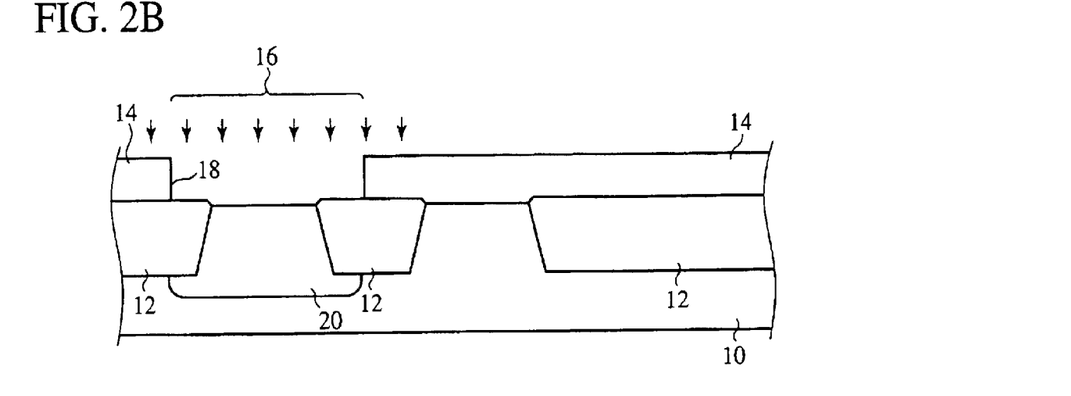

Then, B (boron) ions as a dopant are implanted with the resist film 14 as a mask to form a p type well 20 in the region 16 for the NMOS transistor to be formed in (see FIG. 2B).

After the p type well 20 has been formed, the resist film 14, which has been used as the mask for the ion implantation, is removed.

Figure 2C:
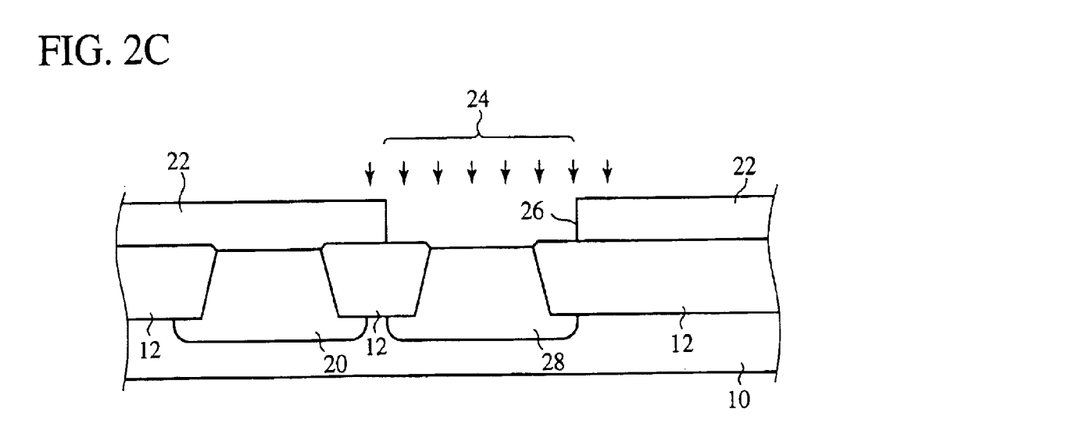

Next, a resist film 22 is formed on the entire surface by, e.g., spin coating. Then, the resist film 22 is patterned by photolithography to form in the resist film 22 an opening 26 for exposing a region 24 of the active region for a PMOS transistor to be formed in.

Next, P (phosphorous) ions as a dopant are implanted with the resist film 22 as a mask to form an n type well 28 in the region 24 for the PMOS transistor to be formed in (see FIG. 2C).

After the n type well 28 has been formed, the resist film 22, which has been used as the mask for the ion implantation, is removed.

Figure 3A:
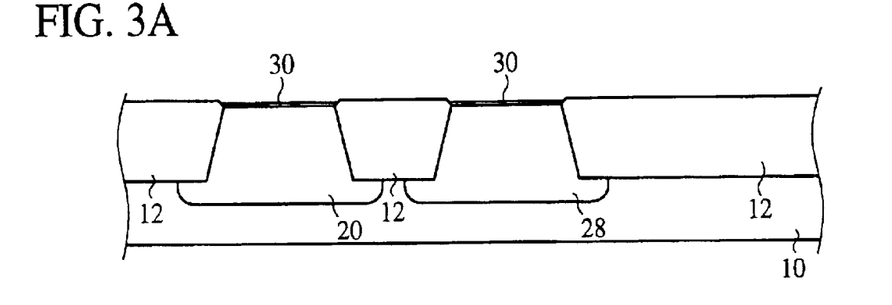
FIGS. 3A–3C are sectional views of the semiconductor device in the steps of the method for fabricating the same according to one embodiment of the present invention, which show the method (Part 2).

After the p type well 20 and the n type well 28 have been formed in the silicon substrate 10, a gate insulation film 30 of a silicon oxynitride film of, e.g., a 1.1 nm-thickness is formed in the active region of the silicon substrate 10 by the surface oxynitridation using, e.g., RTA (Rapid Thermal Annealing) (see FIG. 3A).

Next, a polysilicon film 32 of, e.g., a 100 nm-thickness is formed on the entire surface by, e.g., CVD. Here, the polysilicon film 32 may be formed by forming an amorphous silicon film and crystallizing the amorphous silicon film by thermal processing.

Figure 3B:
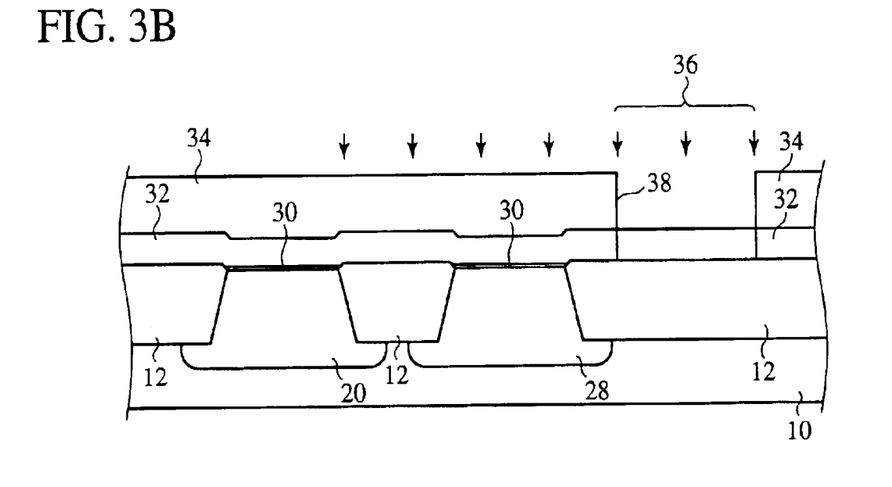

Then, a resist film 34 is formed on the entire surface by, e.g., spin coating. Then, the resist film 34 is patterned by photolithography to form in the resist film 34 an opening 38 for exposing a region 36 for a resistance element to be formed in, which is on the element isolation film 12.

Next, with the resist film as a mask, B ions as a dopant are implanted into the polysilicon film 32 in the region 36 for the resistance element to be formed in (see FIG. 3B). Conditions for the ion implantation are, e.g., a 5 keV acceleration energy and a $2 \times 10^{15}$ cm$^{-2}$ dose. This adjusts the resistance value of the resistance element to be formed concurrently with forming the CMOS transistor. Conditions for the ion implantation, such as a kind, a dose, etc. of the dopant, are suitably set to thereby set the resistance value of the resistance element at a desired value.

Then, the ashing, the processing with sulfuric acid-hydrogen peroxide mixture and the processing with ammonia-hydrogen peroxide mixture are sequentially performed to thereby remove the resist film 32 used as the mask for the ion implantation. Conditions for the ashing are, e.g., a mixed gas of $O_2$, $CF_4$ and $H_2$ as an ashing gas, a 1 kW power and 60 seconds of the processing time. Conditions for the sulfuric acid-hydrogen peroxide mixture processing and ammonia-hydrogen peroxide mixture processing are respectively, e.g., 600 seconds of processing time.

As described above, the method for fabricating the semiconductor device according to the present embodiment is characterized mainly in that before the gate electrode of the transistor to be formed concurrently with forming the resistance element is patterned, ions are implanted for adjusting the resistance value are implanted, with the resist film 34 as a mask, into the polysilicon film 32 in the region for the resistance element to be formed in.

When the ion implantation for adjusting the resistance value of the resistance element is performed after the gate electrode has been patterned, a resist film to be used as the mask must be formed in the region for the transistor to be formed in where the gate electrode has been patterned. Accordingly, the resist film used as the mask must be removed by ashing and wet processing using sulfuric acid-hydrogen peroxide mixture and ammonia-peroxide mixture after the ion implantation. However, the ashing and the wet processing for removing the resist film withdraw not only the resist film used as the mask but also the silicon substrate surface in the region to be the extension region of the extension source/drain, and others, which are not covered by the gate electrode.

In contrast to this, in the method for fabricating the semiconductor device according to the present embodiment, as described above, ions for adjusting the resistance value are implanted, with the resist film 34 as a mask, into the polysilicon film 32 in the region 36 for the resistance element to be formed in. Owing to this, the silicon substrate surface in the region to be the extension region of the extension source/drain, and others is free from the withdrawal when the resist film is removed after the ion implantation for adjusting the resistance value of the resistance element has been performed. The withdrawal of the silicon substrate surface does not take place even when the ion implantation for adjusting the resistance value of the resistance element is performed especially at a high dose of, e.g., above $1\times10^{15}$ $cm^{-2}$, and the ashing and the wet processing must be performed for long for the removal of the resist film used as the mask. Thus, when the resistance element is formed concurrently with forming the transistor, the withdrawal of the silicon substrate surface in the extension region can be suppressed. This produces the following advantageous effects.

First, the depth of the ion implantation in the extension region of the transistor which is formed concurrently with forming the resistance element can be made shallow, whereby the intrusion of the dopant into below the gate can be suppressed, and resultantly the shortening of the effective channel length can be suppressed.

Secondly, the generation of intense electric fields at the interface between the extension region and the gate of the transistor can be suppressed, and thus the generation of hot carriers can be suppressed.

Furthermore, the punch-through, namely the concentration of ions in the interface between the extension region and the gate of the transistor taking place when ions are implanted into the extension region can be suppressed.

Figure 3C:
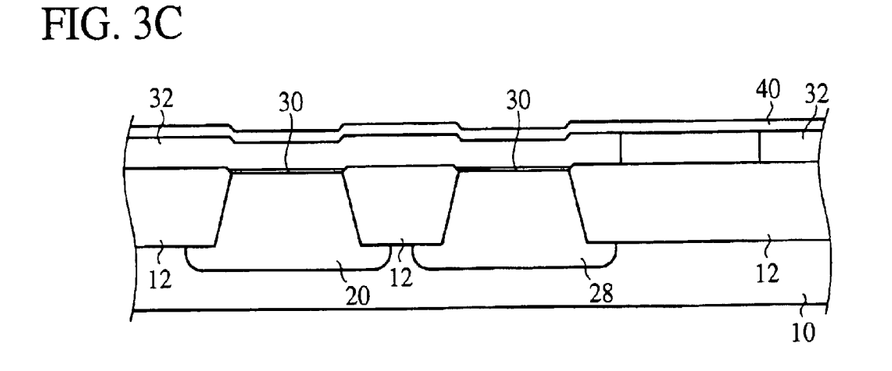

After the resist film 34 used as the mask has been removed as described above, a silicon oxide film 40 of, e.g., a 30 nm-thickness is formed on the polysilicon film 32 by, e.g. CVD (see FIG. 3C).

Then, a resist film 42 is formed on the silicon oxide film 40 by, e.g., spin coating. Then, the resist film 42 is left on the gate electrode and in the region for the resistance element to be formed in by photolithography (see FIG. 4A).

Figure 4A:
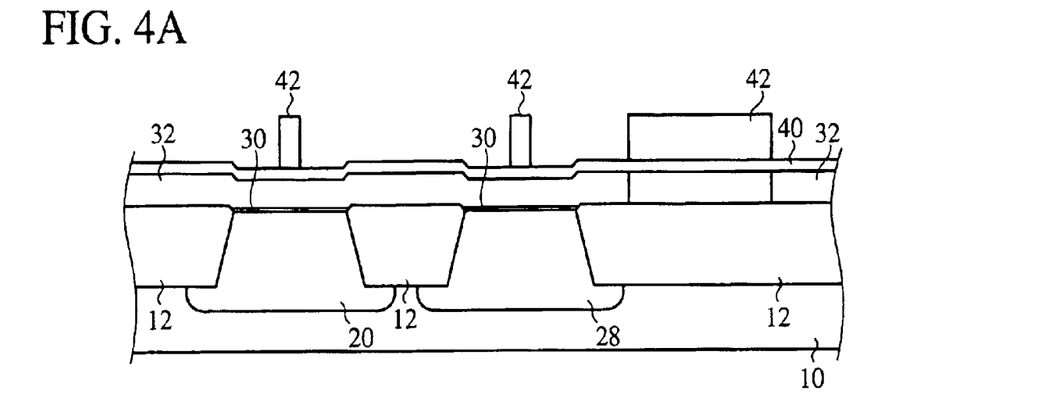
FIGS. 4A–4C are sectional views of the semiconductor device in the steps of the method for fabricating the same according to one embodiment of the present invention, which show the method (Part 3).
Figure 4B:
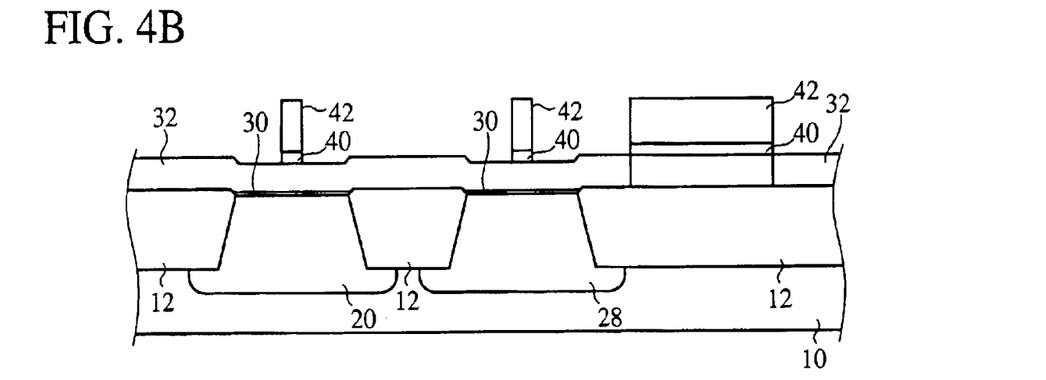

Next, with the resist film 42 as a mask, the silicon oxide film 40 to be used as a hard mask is patterned by, e.g., RIE (Reactive Ion Etching) (see FIG. 4B).

Figure 4C:
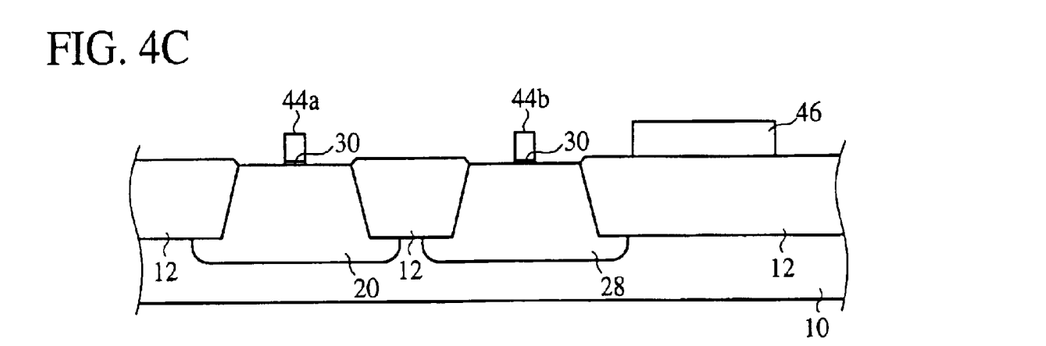

Then, with the resist film 42 and the silicon oxide film 40 as a mask, the polysilicon film 32 is patterned by, e.g., RIE to form the gate electrodes 44a, 44b and the resistance element 46 of the polysilicon film 32 (see FIG. 4C).

The method for fabricating the semiconductor device according to the present embodiment is also characterized mainly in that the gate electrodes 44a, 44b are formed before dopant ions are implanted into the polysilicon film 32 in the region 16 for the NMOS transistor to be formed in and the region 24 for the PMOS transistor to be formed in. This makes no difference in the etching mechanism of the polysilicon film 32 between the region 16 for the NMOS transistor to be formed in and the region 24 for the PMOS transistor to be formed in when the gate electrodes 44a, 44b are patterned, whereby the gate electrodes of the NMOS transistor and the PMOS transistor can be formed in the same configuration.

After the gate electrodes 44a, 44b and the resistance element 46 have been formed, the resist film 42 and the silicon oxide film 40 used as the etching mask are removed.

Figure 5A:
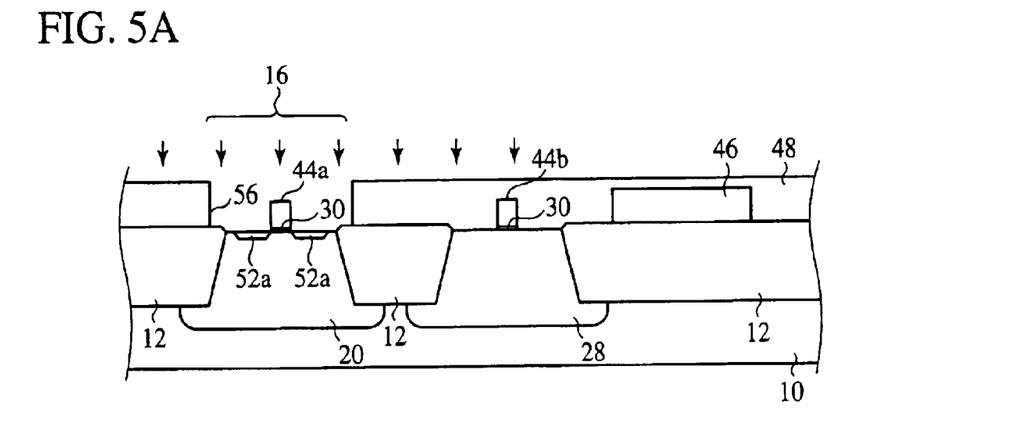
FIGS. 5A–5C are sectional views of the semiconductor device in the steps of the method for fabricating the same according to one embodiment of the present invention, which show the method (Part 4).

Next, a resist film 48 is formed on the entire surface by, e.g., spin coating. Then, the resist film 48 is patterned by photolithography to thereby form an opening 50 for exposing the region 16 for the NMOS transistor to be formed in.

Then, with the gate electrode 44a and the resist film 48 as a mask, As (arsenic) ions as a dopant are implanted. Thus, extension regions 52a forming a shallow region of the extension source/drain are formed in the silicon substrate 10 by self-alignment with the gate electrode 44a (see FIG. 5A). Conditions for the ion implantation can be, e.g., a 3.0 keV ions acceleration energy and a $1.0\times10^{15}$ $cm^{-2}$ dose. Concurrently therewith, the dopant is implanted into the gate electrode 44a.

After the extension regions 52a have been formed, the ashing, sulfuric acid-hydrogen peroxide mixture processing and the ammonia-hydrogen peroxide mixture processing are sequentially performed to thereby remove the resist film 48 used as the mask for the ion implantation. As conditions for the ashing, for example, the ashing gas is a mixed gas of $O_2$, $CF_4$, $N_2$ and $H_2$, the power is 1 kW, and the processing time is 30 seconds. As conditions for the sulfuric acid-hydrogen peroxide mixture processing and the ammonia-hydrogen peroxide mixture processing, for example, the respective processing times are 600 seconds and 300 seconds. The conditions for the ion implantation for forming the extension regions 52a permits the ashing, the sulfuric acid peroxide aqueous solution processing, the ammonium peroxide aqueous solution processing, etc. to be performed in shorter periods of time than those for removing the resist film 34 used as the mask for the ion implantation for adjusting the resistance value of the resistance element.

Figure 5B:
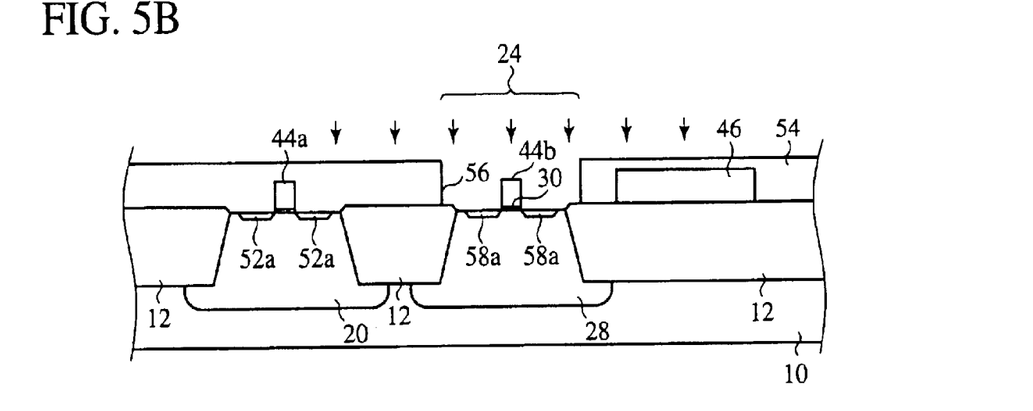

Then, a resist film 54 is formed on the entire surface by, e.g., spin coating. Then, the resist film 54 is patterned by photolithography to form in the resist film 54 an opening 56 for exposing the region 24 for the PMOS transistor to be formed in.

Then, with the gate electrode 44b and the resist film 54 as a mask, B ions as a dopant are implanted. This forms extension regions 58a forming a shallow region of the extension source/drain in the silicon substrate 10 by self-alignment with the gate electrode 16 (see FIG. 5B). As conditions for the ion implantation, for example, the ions acceleration energy can be 0.3 keV, and the dose can be $1.0 \times 10^{15}$ cm$^{-2}$. Concurrently therewith, the dopant is implanted also into the gate electrode 44b.

After the extension regions 58a have been formed, the ashing, the sulfuric acid-hydrogen peroxide mixture processing and the ammonia-hydrogen peroxide mixture processing are sequentially performed to thereby remove the resist film 54 used as the mask for the ion implantation. The conditions for the ion implantation for forming the extension regions 58a permits the ashing, the sulfuric acid-hydrogen peroxide mixture processing, the ammonia-hydrogen peroxide processing, etc. to be performed in shorter periods of time than those for releasing the resist film 34 used as the mask for the ion implantation for adjusting the resistance value of the resistance element.

Figure 5C:
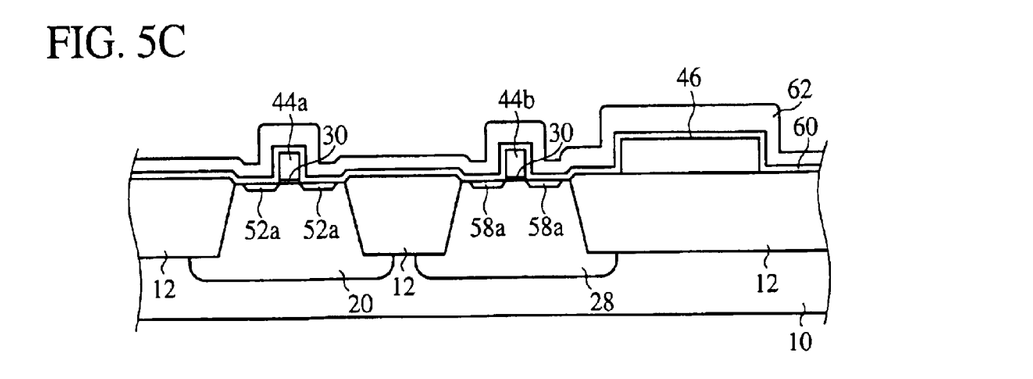

Then, a silicon oxide film 60 of, e.g., a 30 nm-thickness is formed on the entire surface by, e.g., CVD. As conditions for forming the silicon oxide film 60, for example, the raw material gas can be TEOS (tetraethoxysilane), the pressure in the film forming furnace can be 0.1–0.4 Torr, the temperature can be 570–640° C., the flow rate of the TEOS can be 300–400 sccm, and the flow rate of O$_2$ can be 2–30 sccm.

Then a silicon nitride film 62 of, e.g., a 800 nm-thickness is formed on the entire surface by, e.g., CVD (see FIG. 5C). As conditions for forming the silicon nitride film 62, for example, the raw material gas can be DCS (dichlorosilane) and NH$_3$, the temperature can be 650–750° C., the flow rate of the DCS can be 50–200 sccm, and flow rate of the NH$_3$ can be 200–1000 sccm.

Then, a resist film 64 is formed on the entire surface by, e.g., spin coating. Then, the resist film 64 is patterned by photolithography, left covering the upper surface of the resistance element 46 and the peripheral part thereof (see FIG. 6A).

Next, with the resist film 64 as a mask, the silicon nitride film 62 and the silicon oxide film 60 are anisotropically etched by, e.g., RIE. A sidewall insulation film 55 of the silicon oxide film 60 and the silicon nitride film 62 is thus formed on the side walls of the gate electrodes 44a, 44b. On the other hand, being masked by the resist film 64, the resistance element 46 is covered with the silicon oxide film 60 and the silicon nitride film 62 (see FIG. 6B). The resistance element 46 is thus covered with the silicon oxide film 60 and the silicon nitride film 62, whereby the resistance element 46 is protected from the silicidation reaction in the silicide process which will be described later.

Figure 6A:
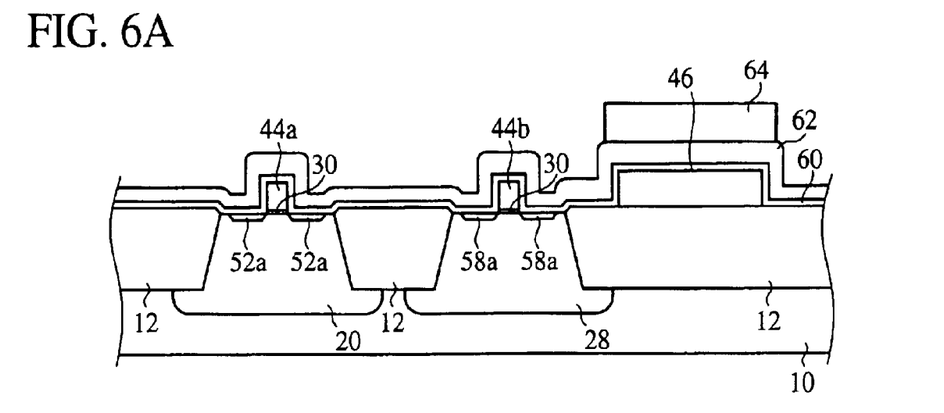
FIGS. 6A–6C are sectional views of the semiconductor device in the steps of the method for fabricating the same according to one embodiment of the present invention, which show the method (Part 5).
Figure 6B:
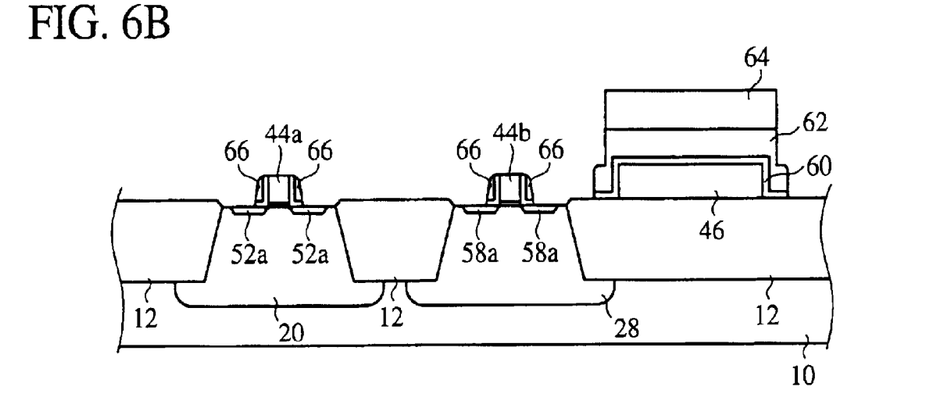

After the sidewall insulation film 66 has been formed, the resist film 64 used as the etching mask, is removed.

Figure 6C:
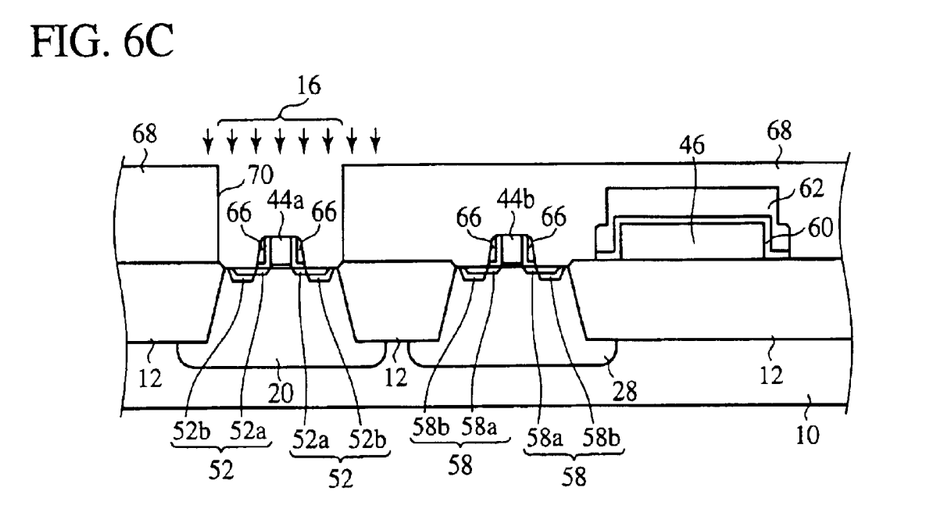

Next, a resist film 68 is formed on the entire surface by, e.g., spin coating. Then, the resist film 68 is patterned by photolithography to thereby form in the resist film 68 an opening 70 for exposing the region 16 for the NMOS transistor to be formed in.

Then, with the gate electrode 44a and the sidewall insulation film 66 as a mask, P ions as a dopant is implanted. The dopant is thus implanted into the gate electrode 44a, and dopant diffused regions 52b forming the deep region of the source/drain are formed (see FIG. 6C). Conditions for the ion implantation are, e.g., a 6 keV ions acceleration energy and a $8 \times 10^{15}$ cm$^{-2}$ dose.

After the dopant diffused regions 52b have been formed, the resist film 68, which has been used as the mask for the ion implantation, is removed.

Figure 7A:
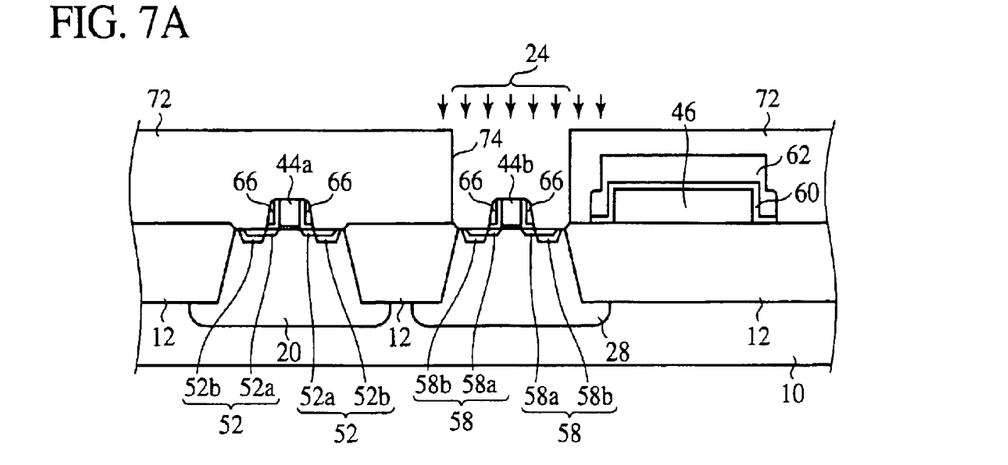
FIGS. 7A–7C are sectional views of the semiconductor device in the steps of the method for fabricating the same according to one embodiment of the present invention, which show the method (Part 6).
Figure 7B:
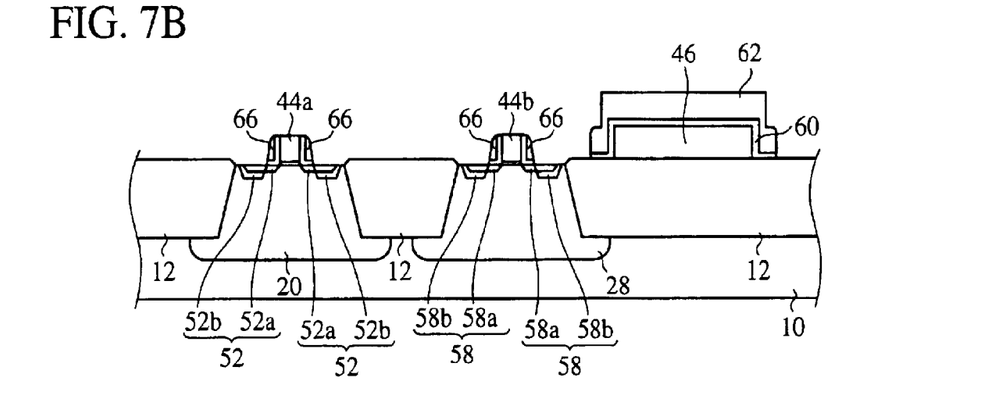

Then, a resist film 72 is formed on the entire surface by, e.g., spin coating. Then, the resist film 72 is patterned by photolithography to form in the resist film 72 an opening 74 for exposing the region 24 for the PMOS transistor to be formed in.

Next, with the gate electrode 44b and the sidewall insulation film 66 as a mask, B ions as a dopant are implanted. The dopant is thus implanted into the gate electrode 44b, and dopant diffused regions 58b forming the deep region of the source/drain are formed (see FIG. 7A). Conditions for the ion implantation are, e.g., a 2 keV ions acceleration energy and a $4 \times 10^{15}$ cm$^{-2}$ dose.

After the dopant diffused regions 58b have been formed, the resist film 72, which has been used as the mask for the ion implantation, is removed.

Then, thermal processing is performed by, e.g., RTA to activate the dopant in the respective extension regions 52a, 58a of the NMOS transistor and the PMOS transistor and in the dopant diffused regions 52b, 58b. This thermal processing activates also the dopant in the resistance element 46. As conditions for the thermal processing by RTA, a nitrogen atmosphere can be used, the heating temperature can be 1000° C., and a heating time can be 5 seconds. Thus, for the NMOS transistor, source/drain diffused layers 52 of the extension source/drain structure formed of the extension region 52a and the dopant diffused region 52b are formed. For the PMOS transistor, source/drain diffused layers 58 of the extension source/drain structure formed of the extension region 58a and the dopant diffused region 58b are formed (see FIG. 7B).

Figure 7C:
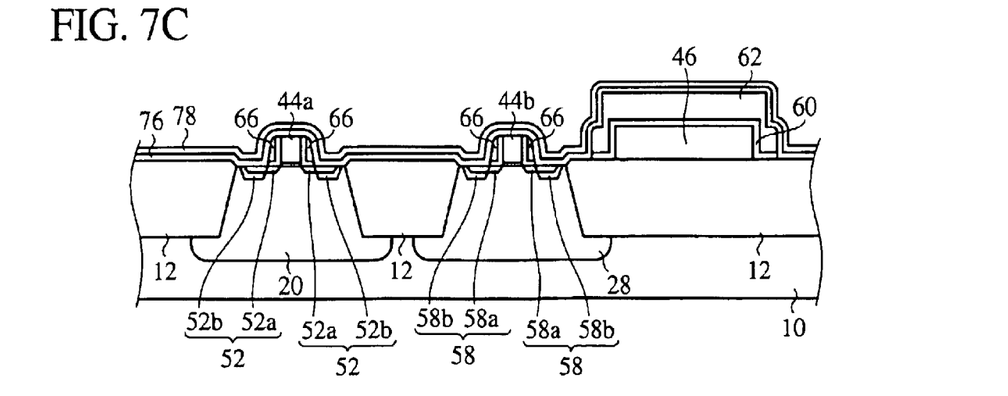

Then, a Co film 76 and a TiN film 78 for siliciding the gate electrodes 44a, 44b and the surface of the source/drain diffused layers 52, 58 are sequentially deposited on the entire surface (see FIG. 7C).

Next, the Co film 76 is silicided by thermal processing, by e.g., RTA. At this time, the Co film 76 on the silicon nitride film 62 covering the sidewall 66, the element isolation film 12 and the resistance element 46 does not react with the oxide film therebelow. Only the Co film 76 deposited on the gate electrodes 44a, 44b and the source/drain diffused layers 52, 58 are silicided by self-alignment, whereby the CoSi$_2$ film 78 is formed selectively on the gate electrodes 44a, 44b and the source/drain diffused layers 52, 58 (see FIG. 8A). The resistance element 46, which is covered with the silicon oxide film 60 and the silicon nitride film 62, is protected from the silicidation reaction.

Figure 8A:
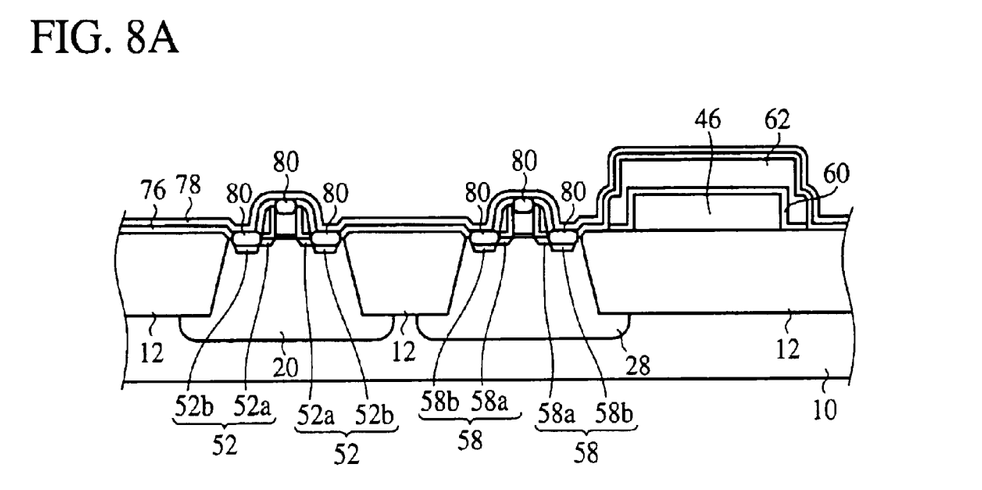
FIGS. 8A–8B are sectional views of the semiconductor device in the steps of the method for fabricating the same according to one embodiment of the present invention, which show the method (Part 7).
Figure 8B:
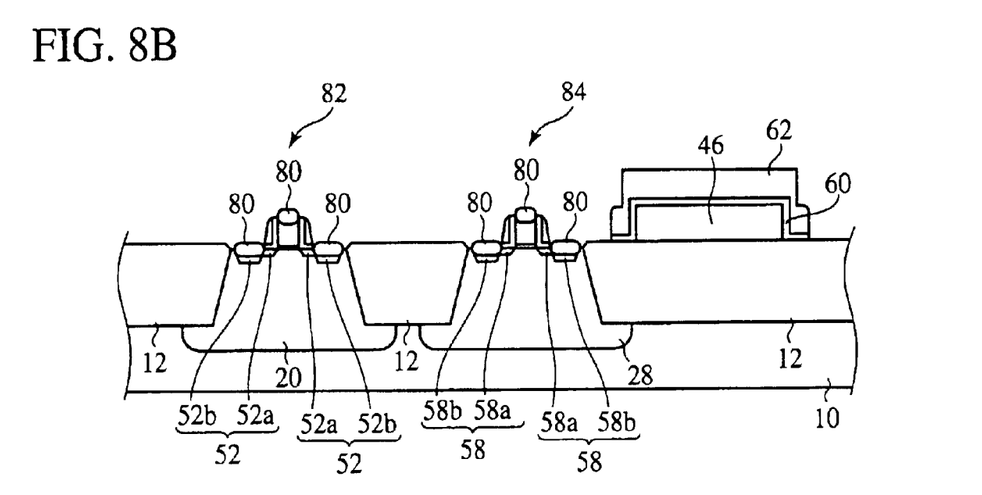

Next, the TiN film 78 and that of the Co film which has not reacted are removed by wet etching, and the salicide process is completed (see FIG. 8B)

Thus, the resistance element 46 is formed of the polysilicon which is not silicided, concurrnetly with forming the NMOS transistor 82 and the PMOS transistor 84 forming the CMOS transistor. The resistance element 46 of the non-silicided polysilicon formed by the method for fabricating the semiconductor device according to the present embodiment can have a sheet resistance of, e.g., about 1 kΩ/square.

As described above, according to the present embodiment, the resist film 34 having the opening 38 exposing the region 36 for the resistance element to be formed in is formed on the polysilicon film 32; dopant ions are implanted into the polysilicon film 32 exposed in the opening 38 with the resist film 34 as a mask so as to adjust the resistance value of the resistance element; the resist film 34 is removed after the ion implantation, and the polysilicon film 32 is etched to form the resistance element 46 in the region of the polysilicon film 32 where the dopant ions have been implanted, and to form the gate electrodes 44a, 44b in the regions 16, 24 of the polysilicon film 32 for the transistor to be formed in, whereby the withdrawal of the silicon substrate surface of the transistor extension regions, etc. can be suppressed.

The withdrawal of the surface of the silicon substrate 10 in the extension regions 52a, 58a of the NMOS transistor 82 and the PMOS transistor 84 and others formed concurrently with forming the resistance element 46 can be suppressed, whereby the depth of the ion implantation in the extension regions 52a, 58a can be made shallow. This suppresses the intrusion of the dopant into below the gates, and resultantly suppresses the shortening of the effective channel length.

The generation of intense electric fields in the interfaces between the extension regions 52a, 58a and the gate electrodes 44a, 44b of the transistors can be suppressed, and thus the generation of hot carriers can be suppressed.

Furthermore, the generation of the punch-through that ions are concentrated on the interface between the extension regions 52a, 58a and the gate electrodes 44a, 44b, which take places when ions are implanted in the extension regions 52a, 58a can be suppressed.

According to the present embodiment, the gate electrodes 44a, 44b are formed before dopant ions are implanted into the polysilicon film 32 in the region 16 for the NMOS transistor to be formed in and the region 24 for the PMOS transistor to be formed in, which permits the gate electrodes 44a, 44b of the NOMOS transistor 82 and the PMOS transistor 84 to be formed in the same configuration.

Thus, the method for fabricating the semiconductor device according to the present embodiment can fabricate the semiconductor device with a high performance having transistors and resistance elements.

[Modifications]

The present invention is not limited to the above-described embodiment and can cover other various modifications.

For example, in the above-described embodiment, one resistance element is formed concurrently with forming a CMOS transistor. However, a plurality of resistance elements may be formed, and in this case, a resistance value of the resistance elements is adjusted by implanting, with a resist film as a mask, dopant ions into the polysilicon film in the respective regions for the plural resistance elements to be formed in. It is possible that a plurality of resistance elements of different resistance values are formed by varying kinds and doses of dopants to be implanted as required.

In the above-described embodiment, B ions are implanted as a dopant so as to adjust the resistance value of the resistance element, but the dopant is not essentially B. Ions of P, etc. may be implanted as dopants for adjusting the resistance value of the resistance element.

In the above-described embodiment, the CMOS transistor having the NMOS transistor and the PMOS transistor, and also the resistance element are formed. The present invention is applicable to a case that the resistance element is formed concurrently with forming either the NMOS transistor or the PMOS transistor.

In the above-described embodiment, the sidewall insulation film has the layered structure of silicon oxide film and silicon nitride film. The structure of the sidewall insulation film is not limited to the above-described layered structure.

In the above-described embodiment, the ion implantation for adjusting the resistance value of the resistance element and the ion implantation for forming the extension regions are separately performed. However, in a case that the same conditions can be used for both of the ion implantation, both may be performed at one time. In this case, with a resist film having openings exposing the region for the NMOS transistor to be formed in or the region for the PMOS transistor to be formed in, and exposing the resistance element as a mask, dopant ions are implanted. The ion implantation for adjusting the resistance value of the resistance element and the ion implantation for forming the extension regions are concurrently performed, whereby a number of the fabrication steps can be decreased.

In the above-described embodiment, polysilicon is used as the material of the resistance element, but the material of the resistance element is not limited to polysilicon. As materials of the resistance element, various semiconductor materials into which dopants can be implanted to thereby adjust the resistance value of the resistance element can be used.

What is claimed is:

1. A method for fabricating a semiconductor device comprising the steps of:

forming a semiconductor film over a semiconductor substrate;

implanting a dopant into a first region of the semiconductor film where a resistance element is to be formed, a second region of the semiconductor film where a gate electrode is to formed being not implanted with the dopant; and patterning the semiconductor film to form the resistance element of the semiconductor film with the dopant implanted, and the gate electrode of the semiconductor film with the dopant not implanted, before any step of implanting any dopant to be implanted into the gate electrode.

2. A method for fabricating a semiconductor device according to claim 1, further comprising, after the step of forming a gate electrode, the step of implanting a dopant into the gate electrode.

3. A method for fabricating a semiconductor device according to claim 2, wherein in the step of implanting the dopant into the gate electrode, the dopant is implanted into the semiconductor substrate on both sides of the gate electrode to form a dopant diffused region.

4. A method for fabricating a semiconductor device according to claim 2, wherein in the step of forming the gate electrode, a first gate electrode and a second gate electrode are formed, and in the step of implanting the dopant into the gate electrode, a first conduction type dopant is implanted into the first gate electrode, and a second conduction type dopant is implanted into the second gate electrode.

5. A method for fabricating a semiconductor device according to claim 3, wherein in the step of forming the gate electrode, a first gate electrode and a second gate electrode are formed, and in the step of implanting the dopant into the gate electrode, a first conduction type dopant is implanted into the first gate electrode, and a second conduction type dopant is implanted into the second gate electrode.

6. A method for fabricating a semiconductor device according to claim 1, wherein in the step of implanting the dopant into the semiconductor film, the dopant is implanted into a plurality of regions of the prescribed region in concentrations different from each other to form a plurality of the resistance elements of resistance values different from each other.

7. A method for fabricating a semiconductor device according to claim 2, wherein in the step of implanting the dopant into the semiconductor film, the dopant is implanted into a plurality of regions of the prescribed region in concentrations different from each other to form a plurality of the resistance elements of resistance values different from each other.

8. A method for fabricating a semiconductor device according to claim 3, wherein in the step of implanting the dopant into the semiconductor film, the dopant is implanted into a plurality of regions of the prescribed region in concentrations different from each other to form a plurality of the resistance elements of resistance values different from each other.

9. A method for fabricating a semiconductor device according to claim 1, further comprising, after the step of forming the gate electrode, the steps of:

forming an insulation film for covering the gate electrode and the resistance element; and etching the insulation film to leave the insulation film on the resistance element and form a sidewall insulation film on the side wall of the gate electrode.

10. A method for fabricating a semiconductor device according to claim 2, further comprising, after the step of forming the gate electrode, the steps of:

forming an insulation film for covering the gate electrode and the resistance element; and etching the insulation film to leave the insulation film on the resistance element and form a sidewall insulation film on the side wall of the gate electrode.

11. A method for fabricating a semiconductor device according to claim 3, further comprising, after the step of forming the gate electrode, the steps of:

forming an insulation film for covering the gate electrode and the resistance element; and etching the insulation film to leave the insulation film on the resistance element and form a sidewall insulation film on the side wall of the gate electrode.

12. A method for fabricating a semiconductor device according to claim 9, further comprising, after the step of forming the sidewall insulation film, the step of forming a metal film on the semiconductor substrate with the gate electrode formed on, performing thermal processing to suicide the metal film to thereby form a suicide film on the gate electrode and the semiconductor substrate on both sides of the gate electrode.

13. A method for fabricating a semiconductor device according to claim 10, further comprising, after the step of forming the sidewall insulation film, the step of forming a metal film on the semiconductor substrate with the gate electrode formed on, performing thermal processing to silicide the metal film to thereby form a suicide film on the gate electrode and the semiconductor substrate on both sides of the gate electrode.

14. A method for fabricating a semiconductor device according to claim 1, wherein in the step of implanting the dopant into the semiconductor film, the dopant is ion implanted at a $1\times10^{15}$ cm$^{-2}$ dose or above.

15. A method for fabricating a semiconductor device according to claim 2, wherein in the step of implanting the dopant into the semiconductor film, the dopant is ion implanted at a $1\times10^{15}$ cm$^{-2}$ dose or above.

16. A method for fabricating a semiconductor device according to claim 3, wherein in the step of implanting the dopant into the semiconductor film, the dopant is ion implanted at a $1\times10^{15}$ cm$^{-2}$ dose or above.

17. A method for fabricating a semiconductor device according to claim 1, wherein in the step of forming the semiconductor film, the semiconductor film is formed of polysilicon or amorphous silicon.

18. A method for fabricating a semiconductor device according to claim 2, wherein in the step of forming the semiconductor film, the semiconductor film is formed of polysilicon or amorphous silicon.

19. A method for fabricating a semiconductor device according to claim 3, wherein in the step of forming the semiconductor film, the semiconductor film is formed of polysilicon or amorphous silicon.

* * * * *